United States Patent [19]
Murakami et al.

[11] Patent Number: 5,808,315
[45] Date of Patent: *Sep. 15, 1998

[54] THIN FILM TRANSISTOR HAVING TRANSPARENT CONDUCTIVE FILM

[75] Inventors: Akane Murakami; Baochun Cui; Minoru Miyazaki, all of Kanagawa, Japan

[73] Assignee: Semiconductor Energy Laboratory Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 770,126

[22] Filed: Dec. 19, 1996

Related U.S. Application Data

[60] Continuation of Ser. No. 474,872, Jun. 7, 1995, abandoned, which is a division of Ser. No. 453,560, May 26, 1995, Pat. No. 5,677,240, which is a continuation of Ser. No. 92,888, Jul. 19, 1993, abandoned.

[30] Foreign Application Priority Data

Jul. 22, 1992 [JP] Japan .................................. 4-215389
Sep. 12, 1992 [JP] Japan .................................. 4-315502

[51] Int. Cl.⁶ ................................................ H01L 29/04
[52] U.S. Cl. ................................ 257/59; 257/72; 349/43
[58] Field of Search ........................... 257/59, 72, 766, 257/57, 66, 347; 359/59, 66, 68, 87, 42, 43, 47

[56] References Cited

U.S. PATENT DOCUMENTS

| | | |
|---|---|---|
| 5,177,577 | 1/1993 | Taniguchi et al. .......................... 257/59 |
| 5,264,077 | 11/1993 | Fukada et al. ......................... 156/659.1 |
| 5,414,278 | 5/1995 | Kobayashi et al. ........................ 257/72 |
| 5,468,987 | 11/1995 | Yamazaki et al. ....................... 257/412 |
| 5,495,353 | 2/1996 | Yamazaki et al. ......................... 349/43 |
| 5,498,573 | 3/1996 | Whetten .................................... 257/59 |
| 5,500,538 | 3/1996 | Yamazaki et al. ......................... 257/59 |
| 5,644,370 | 7/1997 | Miyawaki et al. ......................... 349/43 |

FOREIGN PATENT DOCUMENTS

| | | | |
|---|---|---|---|
| 60-0016462 | of 1985 | Japan ..................................... 437/937 |
| 61-183971 | 8/1986 | Japan ..................................... 257/59 |
| 62-286271 | 12/1987 | Japan ..................................... 257/72 |
| 0074033 | of 1988 | Japan ..................................... 437/937 |
| 0187983 | of 1989 | Japan ..................................... 437/181 |
| 0212976 | of 1991 | Japan ..................................... 437/181 |

*Primary Examiner*—Minh-Loan Tran
*Attorney, Agent, or Firm*—Sixbey, Friedman, Leedom, & Ferguson, P.C.; Gerald J. Ferguson, Jr.; Evan R. Smith

[57] ABSTRACT

According to a transparent conductive film forming method, after an ITO (Indium Tin Oxide) thin film is formed at room temperature by a sputtering method, an annealing treatment is conducted on the film under hydrogen atmosphere at a suitable temperature such as a temperature higher than 200° C.

13 Claims, 9 Drawing Sheets

THIN FILM TRANSISTOR HAVING TRANSPARENT CONDUCTIVE FILM

This application is a Continuation of Ser. No. 08/474,672 filed Jun. 7, 1995, now abandoned; which itself is a division of Ser. No. 08/453,560 filed May 26, 1995 now U.S. Pat. No. 5,677,240; which is a continuation of Ser. No. 08/092,888 filed Jul. 19, 1993 now abandoned.

BACKGROUND OF THE INVENTION

1. Field of the Invention

This invention relates to a method for forming a transparent conductive film and a method of producing a device such as liquid crystal display, image sensor or solar cell or the like using an ITO which is a transparent conductive film, and particularly to enable an ITO to have low resistance and simplify a process when a TFT (thin film transistor) and an ITO is combined with each other.

2. Description of Related Art

An ITO (Indium Tin Oxide) has been used in a wide field such as a solar cell, a liquid crystal display, an image sensor, etc. because of its transparent and electrical conductive property. Particularly in these fields, high transparency and low resistance are frequently required. As a method of forming an ITO has been used various methods such as a sputtering method, an evaporation method (including electron beam evaporation), a CVD method (particularly plasma CVD), a spray method, etc. Of these methods, the sputtering method has been most generally used because it provides a thin film having excellent sealing property, low resistance and high transmittance. A DC sputtering using a D.C. power and a RF sputtering using a high frequency power are known as sputtering. The DC sputtering is superior in mass productivity. In this case, particularly in order to obtain a low-resistant film, it is frequently adopted that the film formation is carried out with heating a substrate, or a film is annealed in oxygen atmosphere or in atmospheric air after the film formation is carried out at room temperature.

However, the following problems occur in the film formation with heating the substrate.

First, there is a problem in heating time and cooling time. At present, a film forming process is progressed so that a tact time is shortened in order to improve productivity. On the other hand, in the above method, it takes a long time for the heating at the film formation and the cooling after the film formation, and thus this method is not practical.

Secondly, a sputtering device is being designed in large-scale at the present stage where the mass production is propagating. As the sputtering device is large, it is more difficult to make the temperature distribution of the heated substrate uniform. If the substrate is not uniformly heated, ununiformity of resistance and film thickness occurs and thus such a film is difficult to be used for a device.

In order to obtain a low resistance ITO film, the film has been practically annealed in the atmospheric air or the oxygen atmosphere after the film formation at the room temperature.

Recently, active matrix liquid crystal displays and contact type image sensor using TFT (thin film transistor) have been particularly popular. As a film forming method for this liquid crystal display, a TFT element is formed on an insulating substrate, and then an ITO is formed as a picture electrode. At this time, the drain (source) of the TFT is connected to the ITO.

After the TFT is formed, the annealing treatment is frequently carried out at hydrogen atmosphere to reduce dangling bond of a channel portion of a semiconductor since the semiconductor as formed has a lot of such defects and an electric characteristic thereof is not good. Accordingly, the process progresses in the following order: TFT formation—annealing under hydrogen—ITO formation at room temperature—annealing under atmospheric air (oxygen).

However, when, for a TFT liquid crystal display or the like, the hydrogen-annealing treatment is carried out after the TFT element is formed, the ITO is formed at room temperature and then the annealing treatment is carried out under atmospheric air (oxygen) as described above, the annealing treatment must be carried out twice. Additionally, the performance of the TFT element is degraded by the annealing treatment under atmospheric air (oxygen), and thus there occur problems that mobility is lowered, sharpness of response is degraded.

SUMMARY OF THE INVENTION

In order to solve the above problems, a method of forming a transparent conductive film according this invention is characterized in that after a transparent conductive oxide film (e.g. an ITO (indium tin oxide) thin film, a zinc oxide thin film and a tin oxide thin film) is formed on an insulating substrate at a temperature of 0° to 100° C. without intentionally heating the substrate using a sputter method, an electron beam evaporation, a plasma chemical vapor deposition or an ion plating method, the transparent conductive oxide film is annealed at a temperature higher than 200° C. preferably 200° to 400° C., more preferably 230° to 380° C. under a hydrogen containing atmosphere having a hydrogen concentration of 95% or more, and further characterized in that the transparent conductive oxide film is subjected to a patterning treatment after it is formed at room temperature and before the annealing treatment under hydrogen atmosphere is carried out. The annealing time of the annealing treatment is 0.5 to 30 hours preferably 1 to 5 hours. Of course, the annealing time is determined by a total consideration of mass productivity, cost and characteristic of the TFT. In a case where a TFT (thin film transistor) is formed on the substrate in a liquid crystal electro-optical device or a contact type image sensor or the like, the method of forming a transparent conductive film according to this invention is characterized in that the transparent conductive oxide film (e.g. an ITO thin film, a zinc oxide thin film or a tin oxide thin film) is formed on the insulating substrate after the TFT is formed on the insulating substrate, and then the TFT and the transparent conductive oxide film are subjected to a hydrogen containing atmosphere. Particularly when the TFT is provided on the substrate, the step of patterning the transparent conductive oxide film is provided between the transparent conductive oxide film forming step and the subjecting step of the TFT and the transparent conductive oxide film to the hydrogen atmosphere. In this case, if the temperature at which the TFT and the transparent conductive oxide film are subjected to the hydrogen containing atmosphere is higher than 200° C. preferably 200° to 400° C., more preferably 230° to 380° C., more excellent effect could be obtained. The TFT (thin film transistor) comprises a non-single crystalline semiconductor.

The annealing temperature of this invention has a limitation of exceeding 200° C., however, it is obvious that the temperature does not exceed those temperatures (heat-resistant temperature) at which the substrate, etc. can endure.

Especially in the present invention, when a top gate type TFT with a gate electrode formed on a semiconductor region is utilized, a remarkable character can be obtained. In a top gate type TFT, an interlayer insulator is formed after a TFT is formed, and then a transparent conductive film is selectively formed. Conventionally, after an interlayer insulator is formed, a metal electrode•wiring connecting a TFT and a transparent conductive film is formed. On the other hand, the present invention shows more efficient characteristic in the structure comprising a process of forming an interlayer insulator, selectively forming a transparent conductive film, and then forming a metal electrode•wiring. The present invention is also effective in a semiconductor device formed by such process. Especially in this case, it is desirable the upper surface of said electrode•wiring comprises a material mainly made of aluminum, and the lower surface touching the ITO film is formed from a material such as chromium and titanium nitride, which can have a good contact with ITO.

In such a structure as this, if hydrogen annealing above mentioned is performed, hydrogen can be activated under a low temperature as 250° to 350° C., by the catalytic effect of aluminum touching the air to hydrogen gas. Therefore effect of hydrogen annealing of the present invention explained in detail in "Effect" as the following is prominently improved. As a result, a low resistance and transparent ITO film can be obtained. Hydrogen plasma should be utilized to obtain the same kind of effect without utilizing aluminum at 400° C. or less, but in that case, a plasma process apparatus should be utilized. Not only the cost of the apparatus, but also process capability is restricted very much. This is not desirable because damages of a plasma is big not only to an ITO film, but also to a device such as a TFT.

In the case that an ITO film is formed after an interlayer insulator is formed and a metal electrode•wiring is formed as before, aluminum cannot be utilized at least for a portion touching an ITO film (the upper surface of said electrode wiring), and effect becomes small because aluminum is not exposed to the air. However, compared with the method in which aluminum is not utilized at all, enough effect can be obtained. In the same way, even if aluminum is not utilized at all for said metal electrode•wiring, big effect can be obtained as long as aluminum is utilized for a gate electrode.

DETAILED DESCRIPTION OF THE PREFERRED EMBODIMENTS

Preferred embodiments according to this invention will be described hereunder with reference to the accompanying drawings.

First, the effect of this invention will be described.

Figure 1:
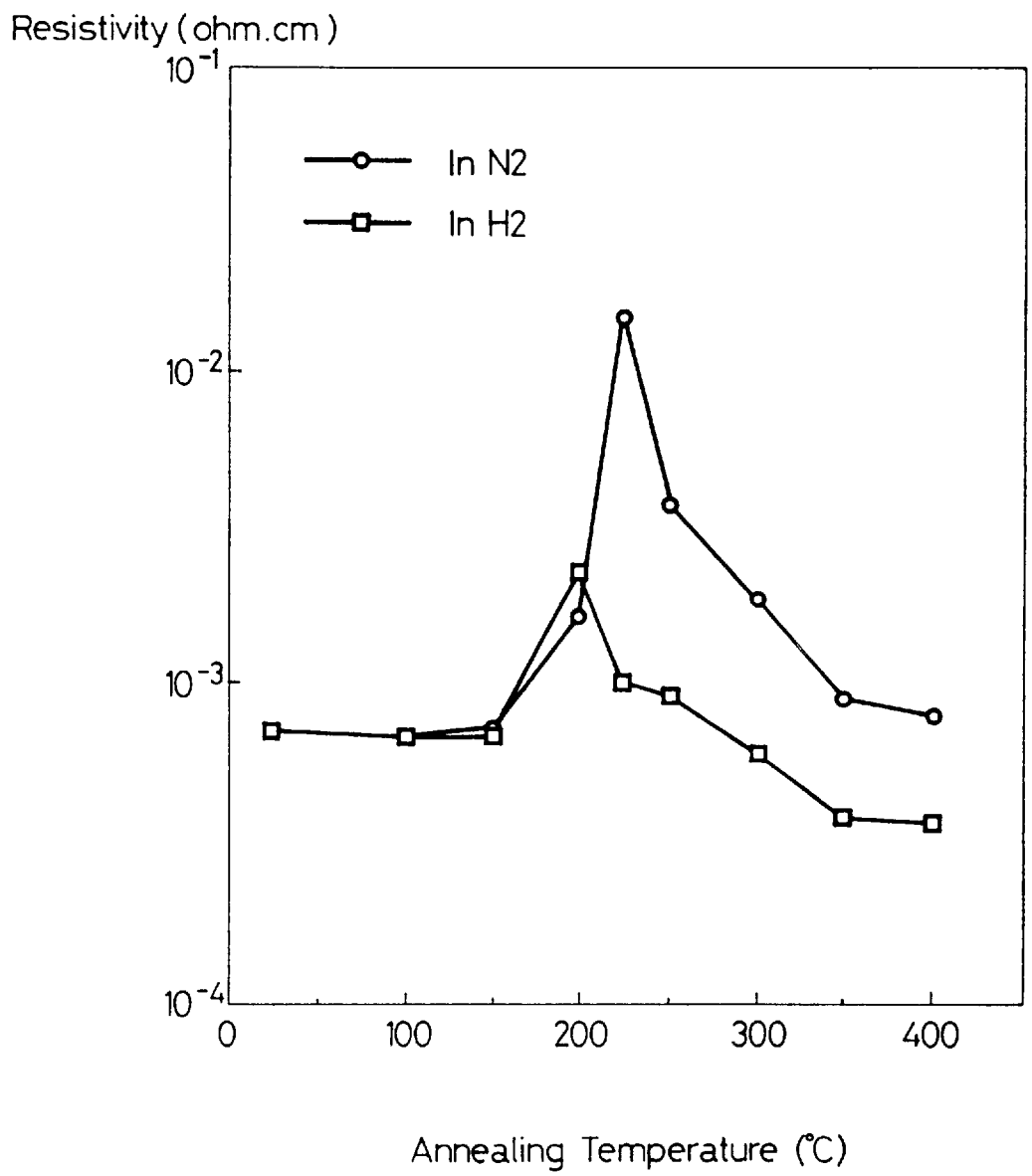
FIG. 1 is a graph showing the relationship between annealing temperature and resistivity.

FIG. 1 is a graph showing the result of the annealing treatment after the ITO film is formed by DC or RF sputtering at a temperature of 0° to 100° C. In FIG. 1, the abscissa represents the annealing temperature and the ordinate represents the resistivity of the film. The annealing time was set to 60 minutes. As is apparent from FIG. 1, when the annealing temperature exceeds about 200° C., the annealing treatment under hydrogen ($H_2$) atmosphere has smaller resistivity than that under nitrogen ($N_2$) atmosphere. Further, under the $N_2$ atmosphere, the resistivity after the film is annealed is larger than that when the film is formed. On the other hand, under the $H_2$ atmosphere, the resistivity after the film is annealed is smaller.

Figure 2A:
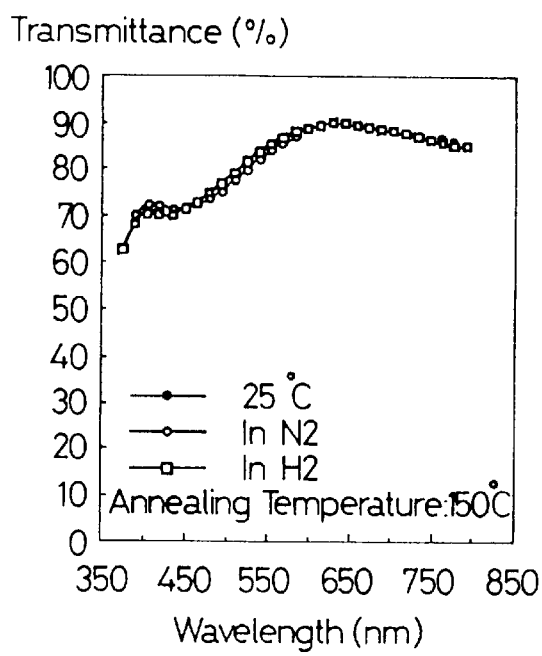
FIGS. 2(A) to 2(C) are graphs showing the wavelength dependence of transmittance with variation of annealing temperature.
Figure 2B:
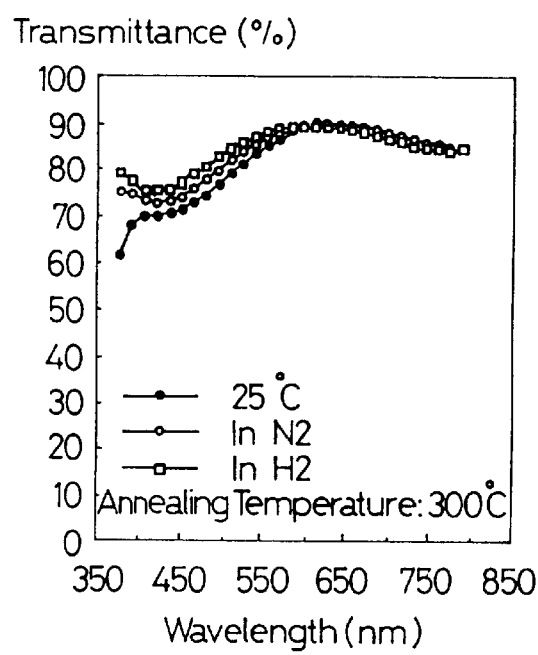
Figure 2C:
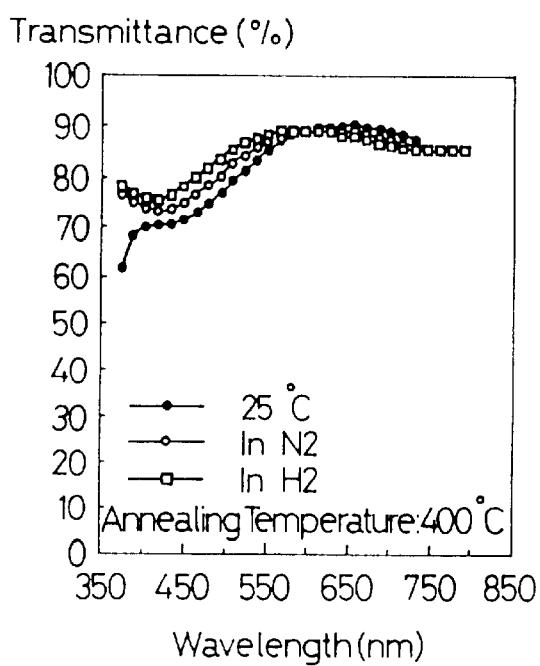

The relationship between the annealing temperature and the light-transmittance is explained by FIGS. 2(A) to 2(C). In this case, the annealing time was set to 60 minutes.

As shown in FIG. 2(A), no improvement in transmittance was obtained under both of $N_2$ atmosphere and $H_2$ atmosphere by 150° C. annealing treatment. On the other hand, as shown in FIGS. 2(B) and 2(C), any improvement in transmittance was obtained particularly for a short-wavelength side by 300° C. and 400° C. annealing treatment, and large transmittance was obtained. A remarkable effect could be obtained particularly by the $H_2$ annealing treatment.

Figure 3:
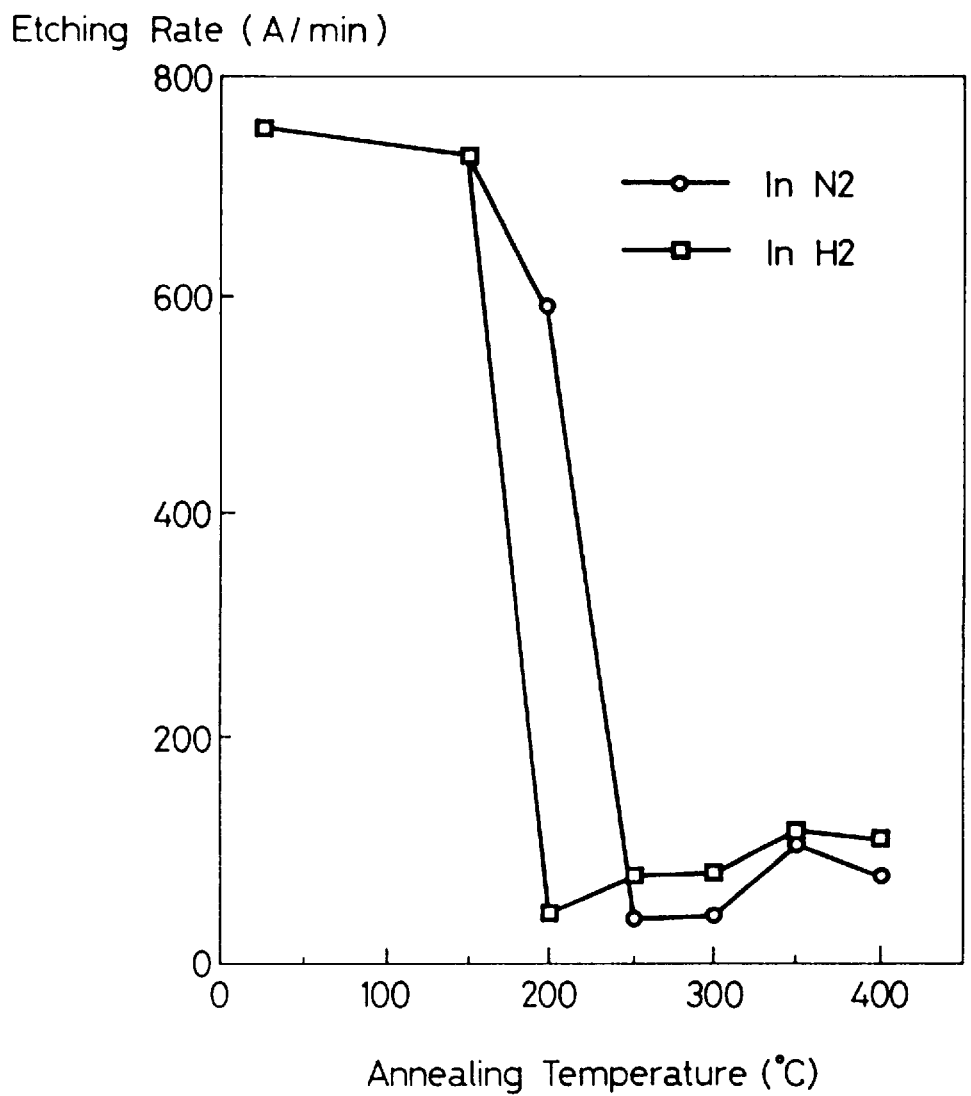
FIG. 3 is a graph showing the annealing-temperature dependence of an etching rate.

FIG. 3 is a graph showing the relationship between the annealing temperature and the etching rate. As is apparent from FIG. 3, when the annealing temperature exceeds about 200° C., the etching rate was greatly lowered in both of the annealing treatments under $H_2$ atmosphere and $N_2$ atmosphere. Therefore, the ITO patterning treatment is preferably carried out before the annealing treatment (above 200° C.).

Figure 4A:
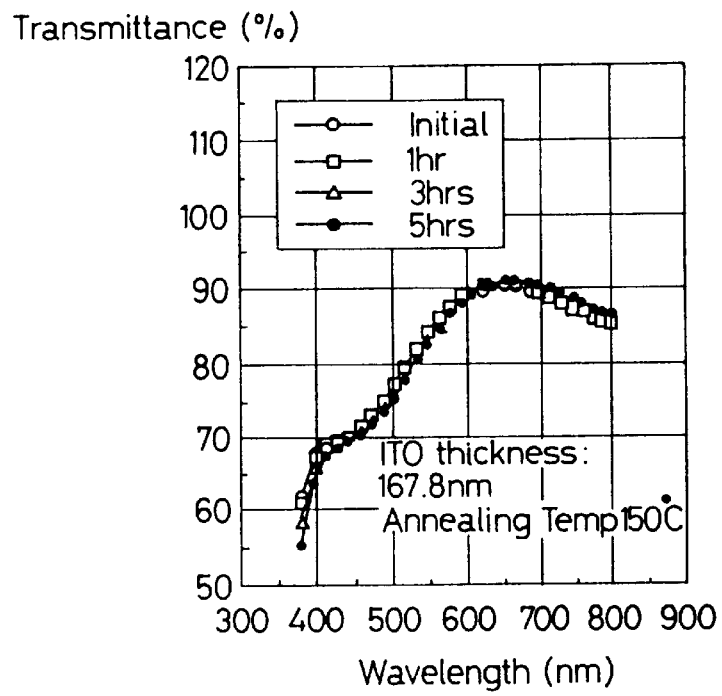
FIGS. 4(A) and 4(B) are graphs showing the wavelength dependence of transmittance with variation of annealing temperature.
Figure 4B:
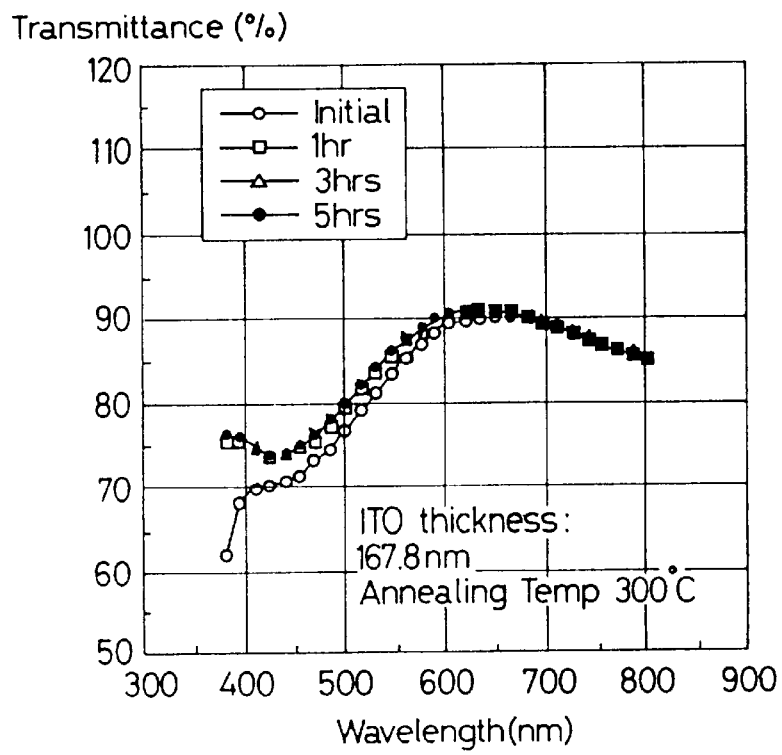

FIGS. 4(A) and 4(B) are graphs showing the transmittance with variation of the annealing time under $H_2$ atmosphere. As is apparent from FIG. 4, a sufficient effect could be obtained by about one-hour annealing treatment, and no more large effect could be obtained even if the annealing treatment is carried out for a time above one hour. That is, about one hour is sufficient as the annealing time.

Figure 5A:
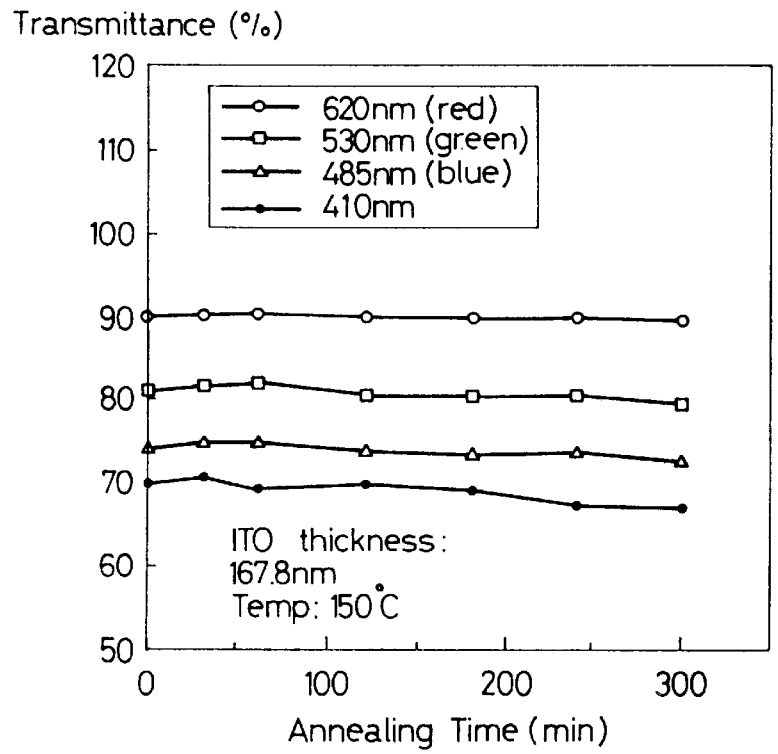
FIGS. 5(A) and 5(B) are graphs showing the annealing-time dependence of transmittance with variation of annealing temperature.
Figure 5B:
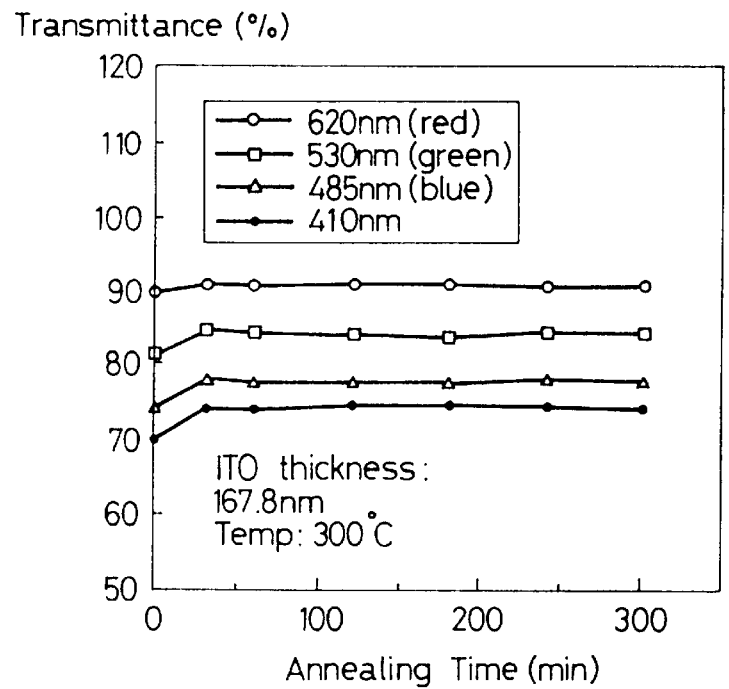

FIGS. 5(A) and 5(B) are graphs showing the relationship between the transmittance and the annealing time under $H_2$ atmosphere. In the 150° C. annealing treatment as shown in FIG. 5(A), no improvement was obtained for long and short wavelength sides. On the other hand, in the 300° C. annealing treatment as shown in FIG. 5(B), any improvement was obtained for both of the long and short wavelength sides. The effect could be obtained for about a half hour (annealing time), and the annealing treatment for about one hour also seems to be sufficient in this case.

This invention may be applied to other embodiments, and these embodiments will be hereunder described.

In this invention, in a case where the ITO is formed after the formation of the TFT element, the process progresses in the following order: TFT element formation—ITO formation—hydrogen annealing treatment, and the step of the annealing treatment under oxygen (air) atmosphere which has been conventionally required can be eliminated.

The details of this invention will be described with reference to various embodiments.

(Embodiment 1)

This embodiment pertains to the ITO formation when a simple matrix liquid crystal display (STN) is produced.

An $SiO_2$ film was formed in 200 Å thickness as a natrium blocking layer on a polished soda-lime glass of 300×200 size by a CVD (Chemical Vapor Deposition) method. Subsequently, an ITO film was formed by a DC magnetron sputtering method. The conditions at this time were as follows: back pressure of $7×10^{-6}$ Torr, oxygen partial pressure of $5×10^{-5}$, sputtering pressure of $5×10^{-3}$, and sputtering current of 1.5 A. The film thus formed had thickness of 1500 Å, sheet resistance of 45 ohms, and resistivity of $6.8×10^{-4}$ ohm·cm. This film was patterned using a generally-marketed etchant to obtain 640 electrode patterns (SEG side), and 480 electrode patterns (COM side). Thereafter, the annealing treatment was carried out under hydrogen atmosphere. The conditions at this time were as follows: annealing temperature of 300° C. and annealing time of 60 minutes. As a result, the resistivity was $3.0×10^{-4}$, and the sheet resistance was 20 ohms. The substrate thus obtained was water-washed, and then polyimide was coated as an orienting film by a print method to obtain a polyimide film of 500 Å.

Subsequently, the surface of the polyimide thin film was subjected to a rubbing treatment using cotton cloth, a 6-micron resin spacer was dispersed on the substrate at the COM side, and epoxy-group thermosetting adhesive agent was printed on the substrate at the SEG side by a screen printing method. Thereafter, these substrates were attached to each other and liquid crystal was injected into a gap between these substrates. Subsequently, a polarizer was attached and then a circuit was connected, so that a liquid crystal display was finally obtained. By forming the ITO film at room temperature as described in this embodiment, the tact time can be shortened and the productivity can be improved. Further, the etching time can be shortened because of the film formation at room temperature, and the sheet resistance can be lowered by the subsequent hydrogen annealing treatment. This is very important to prevent rounding of a signal to be applied.

(Embodiment 2)

In this embodiment, the oxygen partial pressure, the sputtering pressure and the sputtering current at the film formation time in the ITO film forming method of this invention will be described.

Figure 6:
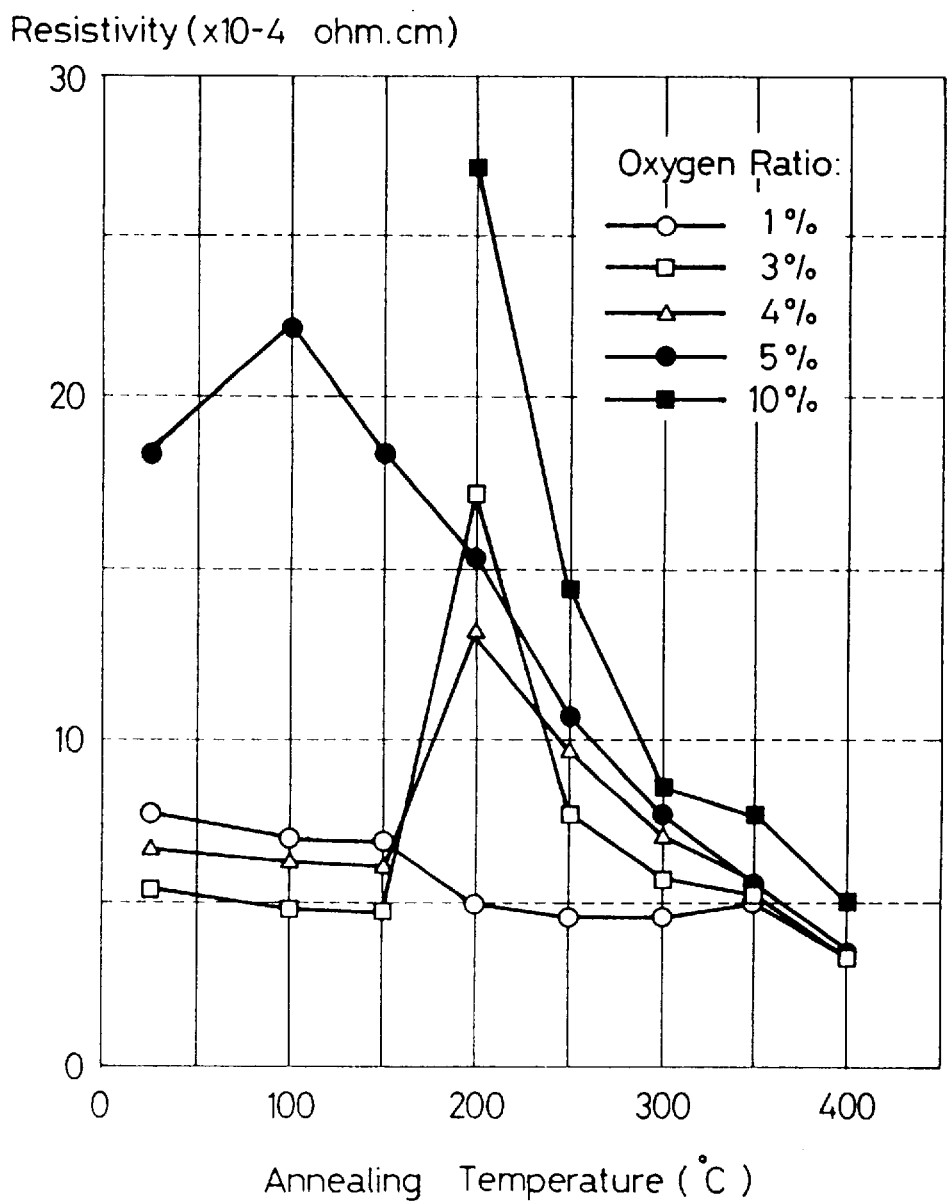
FIG. 6 is a graph showing the annealing-temperature dependence of resistivity with variation of partial pressure of oxygen.

FIG. 6 shows the relationship between the annealing temperature and the resistivity with variation of oxygen partial pressure (represented by a ratio to sputtering pressure). The measurement was made at the annealing time of 60 minutes, under hydrogen atmosphere, at sputtering pressure of $3×10^{-3}$ Torr and at sputtering current of 1.5 A.

As is apparent from FIG. 6, the resistance of the film before the annealing treatment is intensively fluctuated with variation of the oxygen partial pressure, however, the fluctuation of the resistance of the film is reduced by annealing the film at a temperature which is above 200° C. and below 400° C. This means that the margin in the ITO film forming process is greatly widened using this invention.

Figure 7:
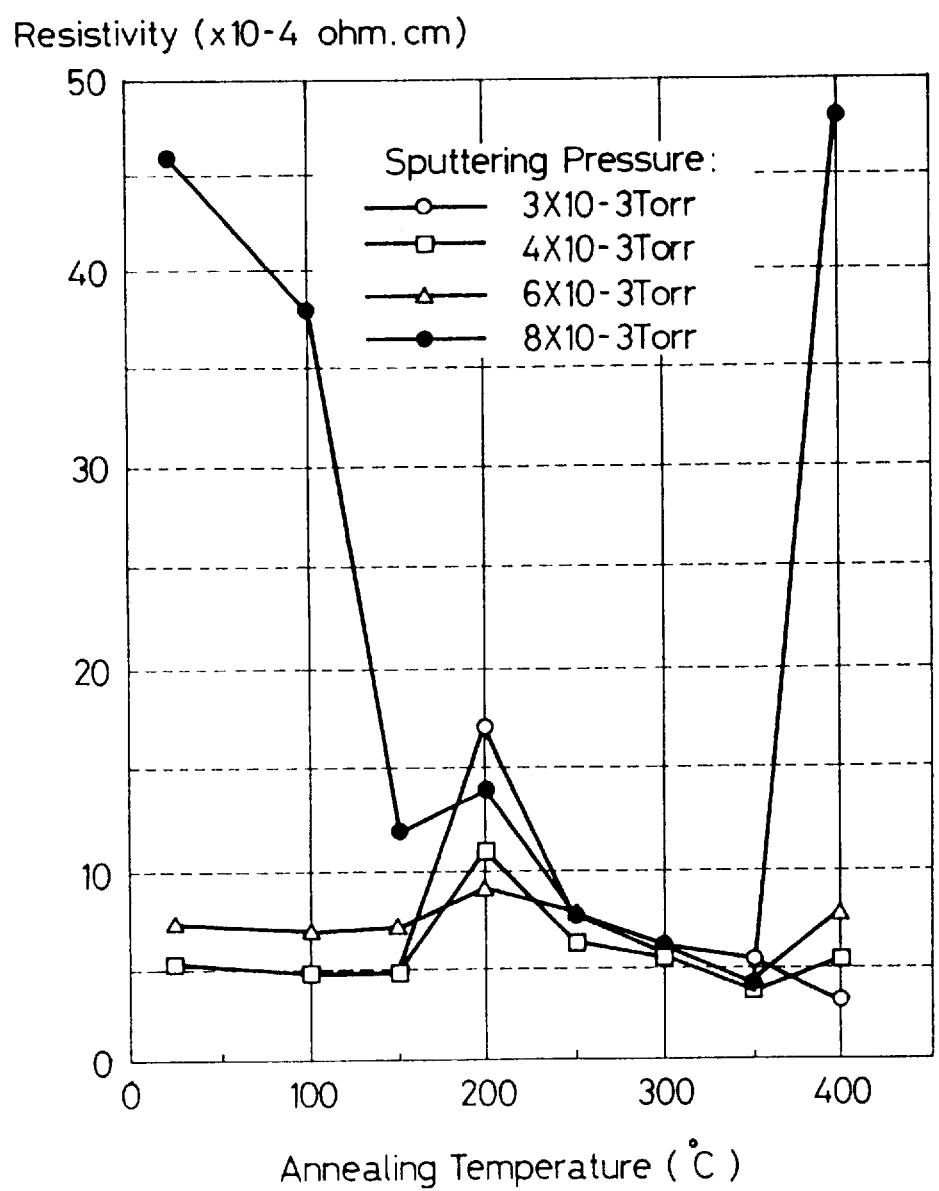
FIG. 7 is a graph showing the annealing-temperature dependence of resistivity with variation of sputtering pressure.

FIG. 7 is a graph showing the relationship between the annealing temperature and the resistivity with variation of sputtering pressure. The conditions at this time were as follows: annealing time of 60 minutes, hydrogen atmosphere, oxygen partial pressure of 3% and sputtering current of 1.5 A.

As is apparent from FIG. 7, the resistance of the film before the annealing treatment is intensively fluctuated with variation of the sputtering pressure. However, by annealing the film at a temperature which is above 200° C. and below 400° C., the film which was formed at the sputter pressure of 3 to $6×10^{-3}$ Torr has lower resistance value and low fluctuation.

Figure 8:
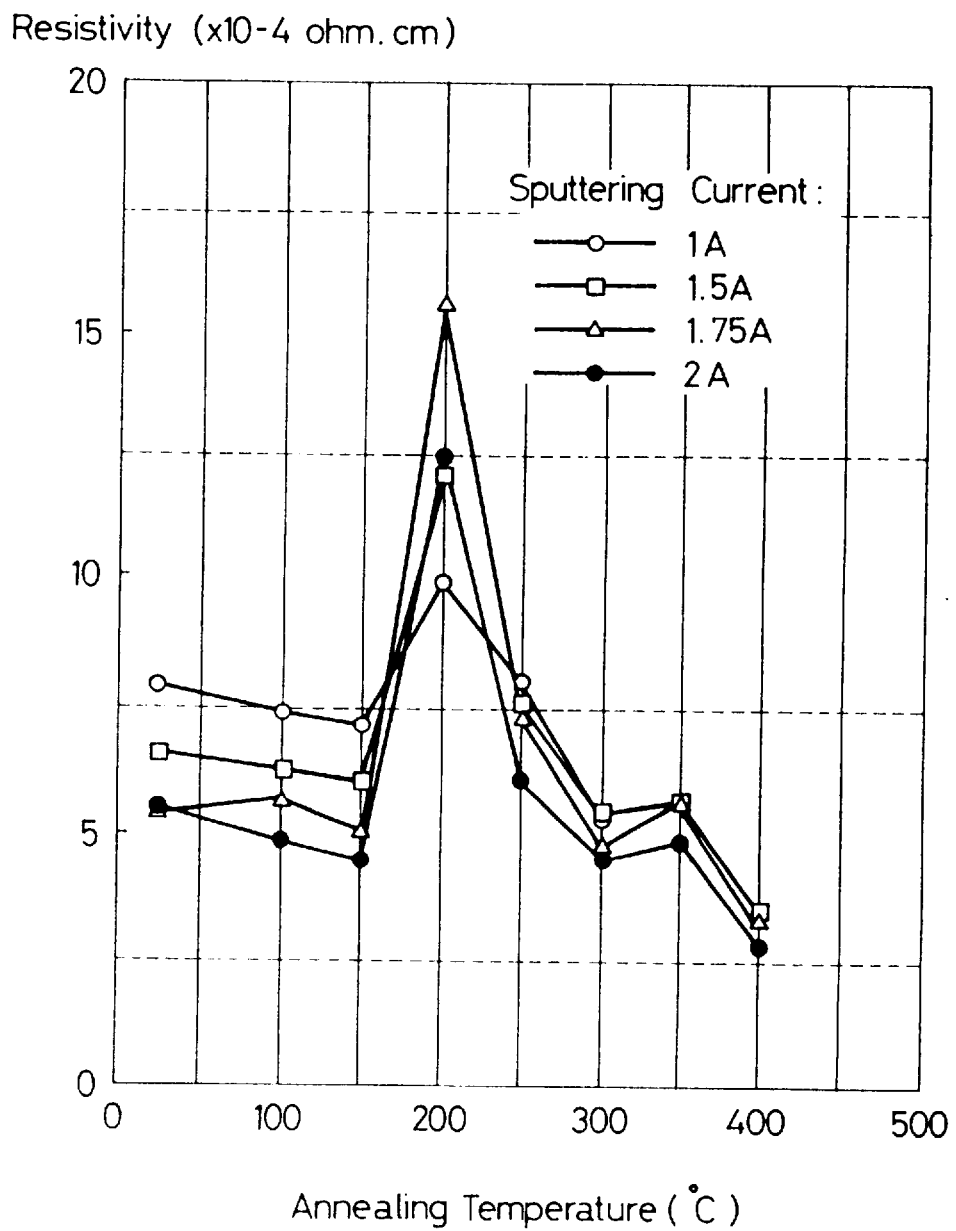
FIG. 8 is a graph showing the annealing-temperature dependence of resistivity with variation of sputtering current.

FIG. 8 is a graph showing the relationship between the annealing temperature and the resistivity with variation of the sputtering current. The conditions at this time were as follows: annealing time of 60 minutes, hydrogen atmosphere, oxygen partial pressure of 3% and sputter pressure of $3×10^{-3}$ Torr.

As is apparent from FIG. 8, by annealing the film at a temperature exceeding 200° C., the resistance value is lowered, and the sputtering-current dependence is depressed. Accordingly, the hydrogen annealing treatment of this invention is also expected to broaden the process margin in the sputtering current.

(Embodiment 3)

The detailed conditions of this embodiment are substantially identical to those of Japanese Patent Application No. 4-30220 which was filed by the inventors of this application, and thus the description thereof is not particularly made. First, N-O glass which is produced by Nippon Electric Glass Corporation was used as a substrate, and a silicon oxide film serving as a sealer was formed in 100 to 800 nm thickness by a sputtering method, a plasma CVD method or a low pressure CVD method. An amorphous silicon coating was formed in 20 to 100 nm thickness on the silicon oxide film by the plasma CVD method, and annealed for 12 to 72 hours at 600° C. under nitrogen atmosphere to be crystallized. The result was patterned to form islandish semiconductor regions (for N-channel TFT and P-channel TFT), and a gate oxide film was deposited in 50 to 200 thickness by the sputtering method.

Subsequently, an aluminum film was formed by the sputtering method or an electron beam deposition method, and patterned to form gate electrode/wiring. Through this process, the outline of the TFT is shaped.

Further, an aluminum oxide film was formed through an anode-oxidation method by flowing current into the gate electrode/wiring in an electrolyte. As the condition of the anode oxidation method was adopted one as disclosed in Japanese Patent Application No. 4-30220 which was filed by the inventors of this application.

Next, electrode-forming holes were formed in the gate oxide film, wirings were formed of chromium, and then current was supplied. At this time, the potential difference was set to 30 to 100 V, preferably to 35 to 50 V. In such a status, the semiconductor regions are annealed due to self-heating of current and electro-migration effect.

Subsequently, a negative voltage was applied to the gate electrode. The gate electrode was supplied with voltage of −30 to −100 V, preferably −35 to −50 V. This state was continued for one hour. Further, during application of the negative voltage to the gate electrode, ultraviolet light of 300 to 350 nm wavelength (power density was set to 100 to 300 $mW/cm^2$, for example) was irradiated from the back surface of the substrate.

For example, even when movable ions such as natrium ions exits in the semiconductor region, these ions are swept out by the application of the voltage. Further, the existence of the electric field causes free hydrogen ions to flow in the semiconductor region and to be trapped by the dangling bonds in the semiconductor (silicon), and such dangling bonds are terminated. Such an effect is described in Japanese Post-examined Patent Application No. 3-19694. This publication discloses possibility of ameliorating defects of bulk of the semiconductor, however, does not disclose the improvement of the interface between the gate insulating film and the semiconductor region which is important for an insulating gate type of semiconductor element (containing a capacitor). Further, the irradiation of ultraviolet light as described above is effective to those defects which are difficult to be removed by only the application of the voltage.

Thereafter, an N-type impurity region (source, drain) and a P-type impurity region were formed by an ion injection method. This process was carried out using a well-known CMOS technique.

Subsequently, a laser annealing treatment was conducted, and then like a normal case a layer insulator was formed by a sputter film forming method of silicon oxide. Thereafter, electrode holes were formed by a well-known photolithography to expose the surface of the semiconductor regions or gate electrode/wiring to the outside, and finally a second metal coating film (aluminum or chromium) was selectively formed and used as electrode/wiring. Thereafter, the ITO film was formed, the patterning treatment was conducted, the annealing treatment was conducted at 250° to 450° C. under hydrogen atmosphere for 30 minutes to 3 hours (one hour in this embodiment), and then hydrogen was doped into the semiconductor region to thereby reduce lattice defects (dangling bond, etc.) and lower the resistance of the ITO, so that the light transmittance could be improved. In the Embodiment 3, the N-O glass is used, however, a synthetic quartz glass may be used instead.

[Embodiment 4]

FIG. 9 shows an example in which an active matrix is formed according to the present invention. As an insulating substrate 1, Coning 7059 glass substrate (1.1 mm thickness, 300×400 mm) is utilized. A silicon nitride film 2 of 5 to 50 nm thickness, preferably 5 to 20 nm thickness is formed on the whole surface of this substrate, by a plasma CVD method. Like this, a technology to have the substrate coated with a film of silicon nitride or aluminum oxide and make this a blocking layer is shown in Pat. Application No. hei 3-238710, and 3-238714.

A silicon oxide film of 100 to 300 nm thickness is formed as a base oxide film 3. This oxide film can be formed by a sputter method in an oxygen atmosphere or by annealing a film at 450° to 650° C. which is formed by decomposing•depositing TEOS by a plasma CVD method.

Figure 9A:
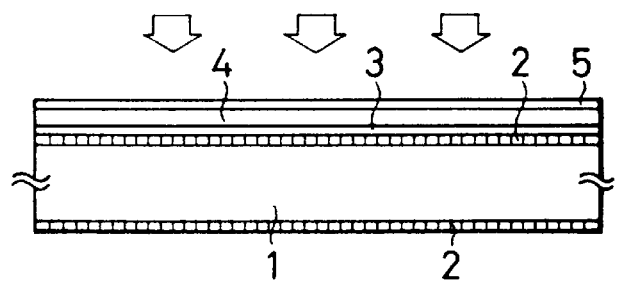
FIGS. 9(A) to 9(E) are cross-sectional views showing a method for forming a liquid crystal display element part.
Figure 9B:
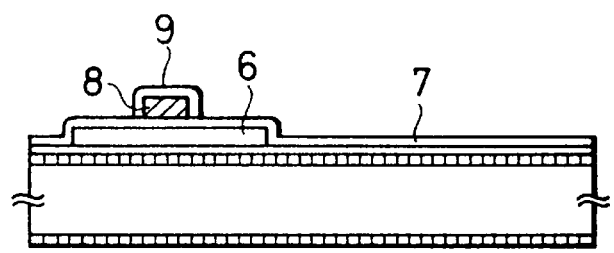

After that, an amorphous type silicon film 4 is deposited by 30 to 150 nm thickness, preferably 50 to 100 nm thickness by a plasma CVD method or LPCVD method. Moreover, a silicon oxide or a silicon nitride film is formed as a protection film 5 by a plasma CVD method, by 20 to 100 nm thickness, preferably 50 to 70 nm thickness. Crystal character of a silicon film 4 is improved by irradiating a pulse laser light of wavelength of 400 nm or less, for example, by irradiating KrF laser light (248 nm). Here, it is preferable that energy density of a laser light is 200 to 350 mJ/cm$^2$. It is preferable the number of shots is 1 to 20 times. A process until now is shown in FIG. 9(A). Instead of improvement of crystal character by laser light, the substrate can be made into crystal by annealing at 600° C. for 24 to 72 hours.

Nextly, the protection film is removed, and the silicon film is patterned to obtain a crystalline semiconductor island region 6. A gate oxide film 7 (a gate insulating layer) is formed by decomposing•depositing TEOS by a plasma CVD method and subsequently annealing at 450° to 650° C. or by a method of sputtering in an oxygen atmosphere. Especially in using the first method, distortion or shrinkage can happen to the substrate according to temperature of this process, and mask-alignment in processes later may get difficult. If a large-area substrate is utilized, it should be utilized carefully. A substrate temperature can be 150° C. or less. It is desirable to perform annealing at 300° to 450° C., preferably 350° to 400° C. in hydrogen, to decrease effect of fixed charge by decreasing dangling bonds and the like in the film.

An aluminum film of 200 nm to 5 μm thickness is formed by electron beam evaporation method, and is patterned. A gate electrode 8 is formed as in FIG. 9(B). The substrate is dipped in an electrolyte solution, and electric current is run through the gate electrode. An anodic oxide film 9 is formed around it. Detailed conditions of this anodic oxidation is shown in Patent Application No. hei 4-30220, 4-38637 and 4-54322 invented by this inventor and others. In this embodiment, the thickness of the anodic oxide film is 200 to 230 nm.

After that, an impurity is injected into an island silicon film of a TFT while utilizing a gate electrode portion (a gate electrode and an anodic oxide film around it) as a mask. Here, phosphorus is injected by utilizing phosphine (PH$_3$) as a doping gas. Dose amount of phosphorus is 2 to 8×10$^{15}$ cm$^{-2}$. To make the impurity region P type, diborane (B$_2$H$_6$) can be utilized as a doping gas.

Figure 9C:
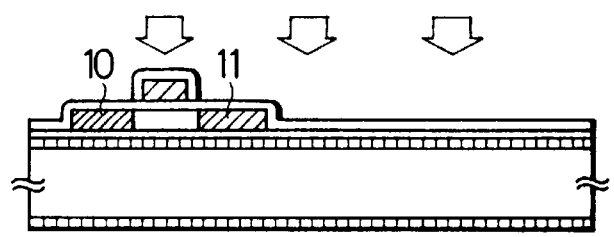

After that, as is shown in FIG. 9(C), crystal character of a portion in which crystal character is degraded by the injection of the impurity is improved by irradiating KrF excimer laser (wavelength 248 nm, pulse width 20 nsec). Energy density of laser is 200 to 400 mJ/cm$^2$, preferably 250 to 300 mJ/cm$^2$. As a result of this, N type regions 10 and 11 are formed. Sheet resistance of this region is 200 to 800 Ω/cm$^2$.

Figure 9D:
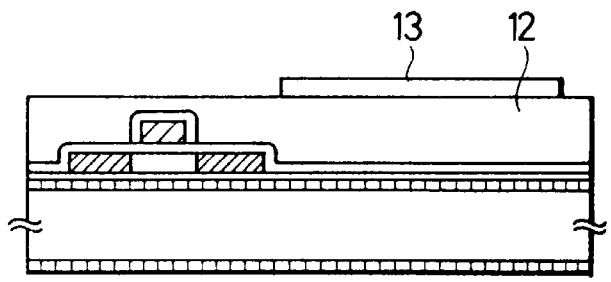
Figure 9E:
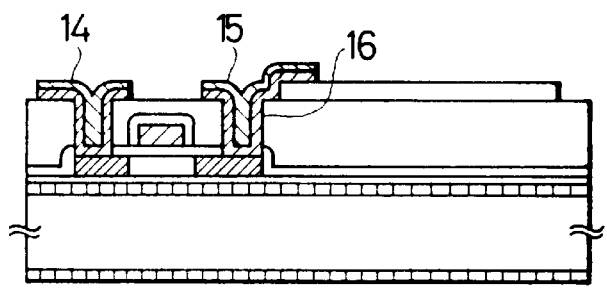

After that, as is shown in FIG. 9(D), an interlayer insulator 12 is formed of silicon oxide over the gate electrode, and a pixel 13 is formed of ITO on a part of the interlayer insulator. DC sputter method is utilized for depositing ITO, and is performed under a condition in which the substrate is not heated. The substrate temperature has reached 50° to 100° C. because of plasma heating. However, the substrate can be cooled as 50° C. or less by cooling the substrate forcedly. After depositing ITO, this is patterned in the shape of a pixel. Then a contact hole is formed in the interlayer insulator, and a chromium film of 5 to 50 nm thickness and an aluminum film of 200 to 1000 nm thickness are formed in succession by a sputter method. This multilayer is patterned, and electrode•wiring 14•15 are formed as in FIG. 9(E). At least one of the electrodes 14 and 15 is connected to ITO to connect at least one impurity region of the TFT with the ITO. As is seen in the figure, because the portion in which this electrode 15 is touched with an ITO film 13 is made of a chromium film 16, contact is good. If titanium nitride is utilized instead of chromium, the same good contact is obtained. Though chromium and titanium nitride has a high resistance, aluminum in the upper layer has a low resistance. Resistance of the wiring as a whole can be controlled low. A single conductive layer may be used instead of the multilayer. The multilayer or the single layer are in contact with an upper surface of the ITO.

Under this condition, the substrate is placed in 99.9% hydrogen under an atmospheric pressure. The crystalline semiconductor region and the ITO are annealed at 250° to 400° C., preferably 350° C. for 30 to 60 minutes, and hydrogenation of silicon and hydrogen annealing of an ITO film 13 is finished.

As described above, according to this invention, productivity can be improved, and a transparent conductive film having high transmittance can be obtained using the novel hydrogen annealing treatment after film formation at room temperature which has not been adopted in the conventional ITO forming method. Additionally, the film has an excellent patterning characteristic. Further, in the case where the ITO film is formed simultaneously with the TFT element, the number of steps can be reduced, and productivity can be improved.

What is claimed is:

1. A semiconductor device comprising:

a transistor comprising a pair of impurity regions and a crystalline channel semiconductor region therebetween over an insulating substrate and a gate electrode adjacent to said channel semiconductor region;

an interlayer insulator provided over said transistor;

a transparent conductive oxide film provided on said interlayer insulator; and a first conductive layer connecting one of said impurity regions of said transistor with said transparent conductive oxide film, said first conductive layer comprising aluminum, wherein a second conductive layer comprising a different material from said first conductive layer is interposed between said first conductive layer and said transparent conductive oxide film in order to prevent a direct contact therebetween.

2. The device of claim 1 wherein said transparent conductive oxide film comprises a material selected from the group consisting of indium tin oxide, zinc oxide and tin oxide.

3. The device of claim 1 wherein said second conductive layer comprises a material selected from the group consisting of chromium and titanium nitride.

4. The semiconductor device of claim 1 wherein said interlayer insulator has a leveled upper surface in contact with said pixel electrode.

5. The semiconductor device of claim 1 wherein said interlayer insulator comprises silicon oxide.

6. A semiconductor device comprising:

a thin film transistor formed over a substrate, said transistor having source, drain and channel regions;

an interlayer insulator formed over said thin film transistor;

a pixel electrode formed on said interlayer insulator, said pixel electrode electrically connected to one of said source and drain regions through a contact hole in said interlayer insulator;

a lead electrically connecting said one of the source and drain regions and said pixel electrode, said lead comprising aluminum; and a conductive layer interposed between said lead and said one of the source region and the drain region in order to prevent a direct contact therebetween, wherein said conductive layer comprises a different material from said lead.

7. The semiconductor device of claim 6 wherein said conductive layer comprises a material selected from the group consisting of chromium and titanium nitride.

8. The semiconductor device of claim 6 wherein said interlayer insulator has a leveled upper surface in contact with said pixel electrode.

9. The semiconductor device of claim 6 wherein said interlayer insulator comprises silicon oxide.

10. A semiconductor device comprising:

a thin film transistor having a crystalline semiconductor layer including channel, source and drain regions therein, formed over a substrate;

an interlayer insulator formed over said thin film transistor;

a pixel electrode comprising a transparent conductive oxide formed on said interlayer insulator;

a lead formed on said interlayer insulator for electrically connecting one of said source and drain regions and said pixel electrode, said lead comprising aluminum;

a conductive layer interposed between said lead and said pixel electrode and between said lead and said one of source and drain regions in order to prevent a direct contact therebetween, wherein said conductive layer comprises a different material from said lead.

11. The semiconductor device of claim 10 wherein said conductive layer comprises a material selected from the group consisting of chromium and titanium nitride.

12. The semiconductor device of claim 10 wherein said interlayer insulator has a leveled upper surface in contact with said pixel electrode.

13. The semiconductor device of claim 10 wherein said interlayer insulator comprises silicon oxide.

* * * * *